United States Patent [19]

Lee

[11] Patent Number: 5,565,367
[45] Date of Patent: Oct. 15, 1996

[54] PROTECTIVE DEVICE FOR AN INTEGRATED CIRCIT AND MANUFACTURING METHOD THEREOF

[75] Inventor: Yeong-Fong Lee, Hsin-Chu, Taiwan

[73] Assignee: Hualon Micro Electronic Corporation, Hsin-chu, Taiwan

[21] Appl. No.: 409,801

[22] Filed: Mar. 24, 1995

[51] Int. Cl.$^6$ .................................. H01L 29/74
[52] U.S. Cl. .................... 437/6; 437/60; 437/30
[58] Field of Search .................. 437/6, 918, 20, 437/152, 27, 30, 51, 60, 911, 915, 54, 56; 257/355, 358, 359, 363, 361, 362, 173

[56] References Cited

U.S. PATENT DOCUMENTS

| | | | |
|---|---|---|---|
| 4,609,931 | 9/1986 | Koke | 257/361 |
| 4,617,482 | 10/1986 | Matsuda | 257/361 |
| 5,148,250 | 9/1992 | Winnerl et al. | 257/363 |
| 5,158,899 | 10/1992 | Yamagata | 437/27 |
| 5,359,211 | 10/1994 | Groft | 257/173 |
| 5,432,368 | 7/1995 | Timenez | 297/355 |
| 5,485,024 | 1/1996 | Reay | 257/173 |
| 5,508,548 | 4/1996 | Tailliet | 257/360 |

FOREIGN PATENT DOCUMENTS

| | | | |
|---|---|---|---|
| 481454(A) | 4/1992 | European Pat. Off. | 257/358 |
| 62-130552(A) | 6/1987 | Japan | 257/358 |
| 4-146665(A) | 5/1992 | Japan | 257/358 |

Primary Examiner—Tom Thomas
Assistant Examiner—S. Mulpuri
Attorney, Agent, or Firm—Foley & Lardner

[57] ABSTRACT

A protective device for an integrated circuit and the manufacturing method thereof is disclosed in which a floating well is formed in a substrate by implanting first conductivity-type impurity into the substrate. The substrate is a second conductivity-type substrate. A diffusion resistor is formed in the well by implanting second conductivity-type impurity into the well. The diffusion resistor has a first terminal to be connected electrically to the driving circuit stage and a second terminal to be connected electrically to the driven circuit stage. A grounded region is formed in the well around the diffusion resistor by implanting second conductivity-type impurity into the well, and by applying a ground reference voltage to the grounded region. The diffusion resistor, the well and the grounded region cooperatively define thereamong a diac region which prevents large current flows from the driving circuit stage to the driven circuit stage when a relatively large voltage is present at the first terminal of the diffusion resistor.

2 Claims, 3 Drawing Sheets

PROTECTIVE DEVICE FOR AN INTEGRATED CIRCIT AND MANUFACTURING METHOD THEREOF

BACKGROUND OF THE INVENTION

1. Field of the Invention

This invention relates to a protective device for an integrated circuit and the manufacturing method thereof, more particularly to a protective device and the manufacturing method thereof which prevents large current flows from a driving circuit stage to a driven circuit stage of the integrated circuit.

2. Description of the Related Art

Presently, metal-oxide semiconductor devices are widely used in integrated circuits. In accordance with currently available semiconductor manufacturing technology, the thickness of a gate oxide of a metal-oxide-semiconductor field effect transistor (MOSFET) is only 120Å to 250Å. Therefore, breakdown of the gate oxide of the MOSFET easily occurs when there is no protective device for preventing undesired large voltage across the MOSFET, thereby resulting in damage to the integrated circuit.

FIG. 1 shows a conventional protective device 1 for an integrated circuit with a driving circuit stage (not shown) and a driven circuit stage 12. The conventional protective device 1 has first and second diodes (13 and 14). The first diode 13 has a cathode connected electrically to an output terminal 11 of the driving circuit stage via a P+-type diffusion resistor (RS) and an anode connected electrically to a ground reference voltage (VSS). The second diode 14 has a cathode connected electrically to a voltage source (VDD) of the driven circuit stage 12 and an anode connected electrically to the output terminal 11 of the driving circuit stage via the diffusion resistor (RS) and to the cathode of the first diode 13. The cathode of the first diode 13 and the anode of the second diode 14 are further connected electrically to the gate terminals of the MOSFET (M1,M2) of the driven circuit stage 12.

When a positive voltage slightly larger than the sum of the voltage of the voltage source (VDD) and 0.7 v is present at the output terminal 11 of the driving circuit stage, the second diode 14 conducts, thereby preventing large current flows from the driving circuit stage to the driven circuit stage 12. On the other hand, when a negative voltage slightly smaller than the sum of the ground reference voltage (VSS) and −0.7 v is present at the output terminal 11 of the driving circuit stage, the first diode 13 conducts, thereby preventing large current flows from the driving circuit stage to the driven circuit stage 12 in the reverse direction. It should be noted that the diffusion resistor (RS) has a large potential difference thereacross when a large current flows therethrough, thereby reducing the voltage at the gate terminals of the MOSFETs (M1,M2) so as to protect the latter. Furthermore, the diffusion resistor (RS) reduces the amount of current flow so as to reduce the joule heat, thereby preventing damage to the integrated circuit due to high temperature.

However, when a voltage much larger than the sum of the voltage of the voltage source (VDD) and 0.7 v or much smaller than the sum of the voltage of the ground reference voltage (VSS) and −0.7 v is present at the output terminal 11, a large current flows from the driving circuit stage to the driven circuit stage 12, thereby resulting in overload of the driving circuit stage. Furthermore, if the current exceeds the trigger current, a latch-up effect occurs. Therefore, the voltage present at the output terminal 11 of the driving circuit stage should be limited within a range of the sum of the voltage of the voltage source (VDD) and 0.7 v and the sum of the voltage of the ground reference voltage (VSS) and −0.7 v to ensure proper operation of the protective device.

Referring to FIG. 2, another conventional protective device for an integrated circuit is shown. An n-type thick field oxide MOSFET (M3) has its gate and drain terminals connected electrically to the output terminal 21 of the driving circuit stage. A first resistor (R1) has a first terminal connected electrically to the drain terminal of the transistor (M3) and a second terminal. A second resistor (R2), which is an N+-type diffusion resistor, has a first terminal connected electrically to the second terminal of the first resistor (R1) and a second terminal connected electrically to the gate terminals of the transistors (M1,M2) of the driven circuit stage.

When a large positive voltage is present at the output terminal 21 of the driving circuit stage, the N-channel of the transistor (M3) conducts and forms a discharge path. At this time, the amount of current flow is relatively small. The drain voltage of the transistor (M3) increases continuously until avalanche breakdown of an N+P− diode formed between the drain terminal and the substrate of the transistor (M3) occurs due to reverse bias. At this stage, a large amount of substrate current flows, and a voltage difference is formed between the source terminal and the substrate of the transistor (M3). The voltage difference triggers the parasitic bipolar transistor so as to turn-on the transistor (M3) in order to permit the dynamic resistance and the substrate resistance of the diode formed by the drain and substrate terminals to be reduced from a number of $K\Omega$ to a number of $\Omega$. Furthermore, since the diode generates a snapback effect due to the avalanche breakdown caused by the reverse bias, the avalanche breakdown voltage is reduced 3 to 10 volts. When the voltage present at the output terminal 21 of the driving circuit stage is lower than the voltage difference between the ground reference voltage (VSS) and the cut-in voltage of the diode, an N+P− diode formed by the drain terminal and the substrate of the transistor (M3) conducts to form a discharge path due to the forward bias.

From the foregoing, it is noted that the voltage present at the output terminal 21 of the driving circuit stage cannot be higher than the reverse breakdown voltage of the drain terminal of the transistor (M3), or cannot be lower than the voltage difference between the ground reference voltage and the cut-in voltage of the diode. Otherwise, a large current flows so as to result in overload of the driving circuit stage and in a latch-up effect thereof. Therefore, in practice, if the voltage output from the driving circuit stage has a relatively absolute value, a voltage level converter must be added to overcome the aforementioned problems.

SUMMARY OF THE INVENTION

Therefore, the main objective of the present invention is to provide a protective device for an integrated circuit and the manufacturing method thereof, which protective device can overcome the aforementioned drawback associated with the prior art.

Accordingly, one aspect of the present invention is to provide a method for manufacturing a protective device in an integrated circuit with a driving circuit stage and a driven circuit stage. The manufacturing method comprises the steps of: (1) implanting first conductivity-type impurity into a second conductivity-type floating semiconductor substrate to form a floating well in the substrate; (2) forming a diffusion resistor in the well by implanting second conductivity-type impurity into the well, the diffusion resistor having a first terminal to be connected electrically to the driving circuit stage and a second terminal to be connected electrically to the driven circuit stage; and (3) forming a grounded region in the well around the diffusion resistor by implanting second conductivity-type impurity into the well, and by applying a ground reference voltage to the grounded region. The diffusion resistor, the well and the grounded region cooperatively define thereamong a diac region which prevents large current flows from the driving circuit stage to the driven circuit stage when a relatively large voltage is present at the first terminal of the diffusion resistor.

Another aspect of the present invention is to provide a protective device for an integrated circuit with a driving circuit stage and a driven circuit stage. The protective device includes a floating semiconductor substrate, a floating well, a diffusion resistor and a grounded region. The floating well is formed in the substrate by implanting first conductivity-type impurity into the substrate, the substrate being a second conductivity-type substrate. The diffusion resistor is formed in the well by implanting second conductivity-type impurity into the well. The diffusion resistor has a first terminal to be connected electrically to the driving circuit stage and a second terminal! to be connected electrically to the driven circuit stage. The grounded region is formed in the well around the diffusion resistor by implanting second conductivity-type impurity into the well, and by applying a ground reference voltage to the grounded region. The diffusion resistor, the well and the grounded region cooperatively define thereamong a diac region which prevents large current flows from the driving circuit stage to the driven circuit stage when a relatively large voltage is present at the first terminal of the diffusion resistor.

BRIEF DESCRIPTION OF THE DRAWINGS

Other features and advantages of the present invention will become apparent in the following detailed description of the preferred embodiment, with reference to the accompanying drawings, of which.

DETAILED DESCRIPTION OF THE PREFERRED EMBODIMENT

Figure 1:
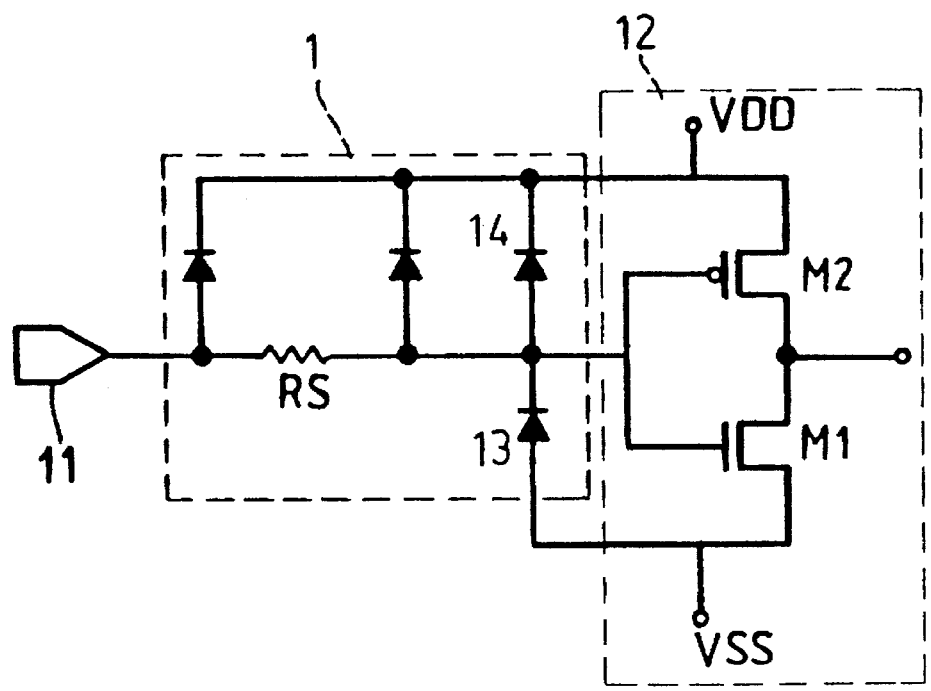
FIG. 1 is a schematic circuit diagram of a conventional protective device for an integrated circuit with a driving circuit stage and a driven circuit stage.
Figure 2:
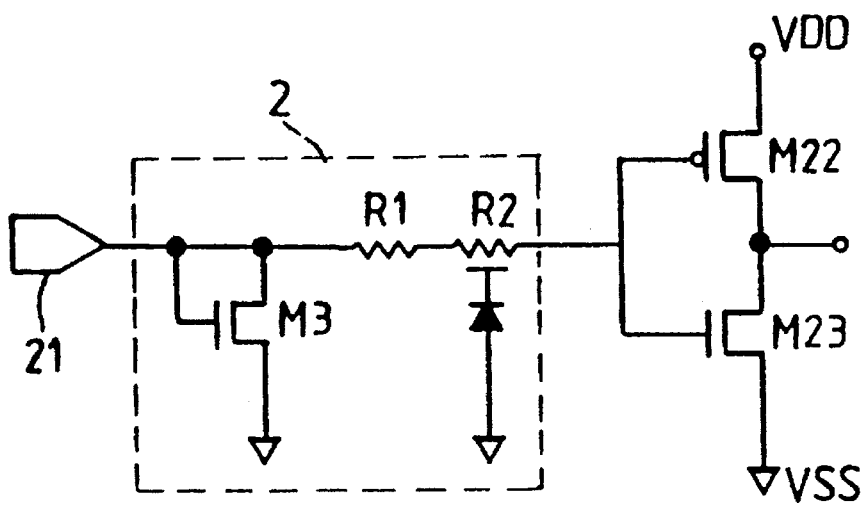
FIG. 2 is a schematic circuit diagram of another conventional protective device for an integrated circuit with a driving circuit stage and a driven circuit stage.

Before the present invention is described in greater detail, it should be noted that like elements are indicated by the same reference numerals throughout the disclosure.

Figure 3:
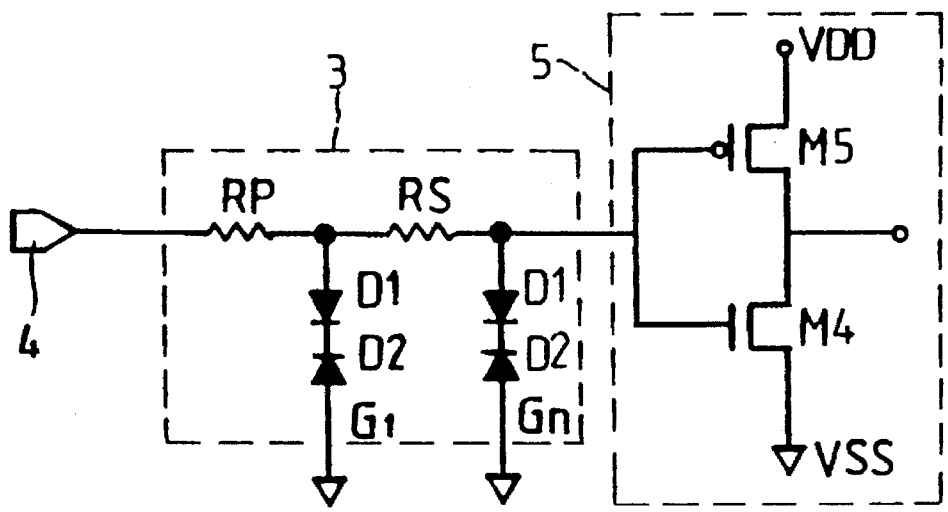
FIG. 3 is a schematic circuit diagram of a protective device for an integrated circuit with a driving circuit stage and a driven circuit stage according to the present invention.
Figure 4:
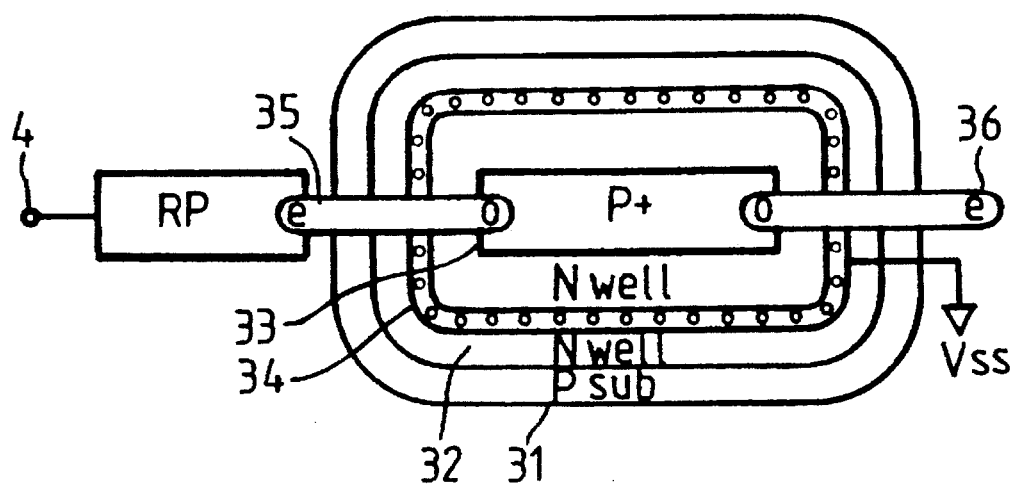
FIG. 4 is a layout of the protective device shown in FIG. 3.

Referring to FIGS. 3 and 4, a protective device 3 for an integrated circuit according to this invention includes a floating semiconductor substrate 31, a floating well 32, a diffusion resistor 33, a grounded region 34 and a polysilicon resistor (RP). The integrated circuit has a driving circuit stage (not shown) which has an output terminal 4, and a driven circuit stage 5.

Figure 5:
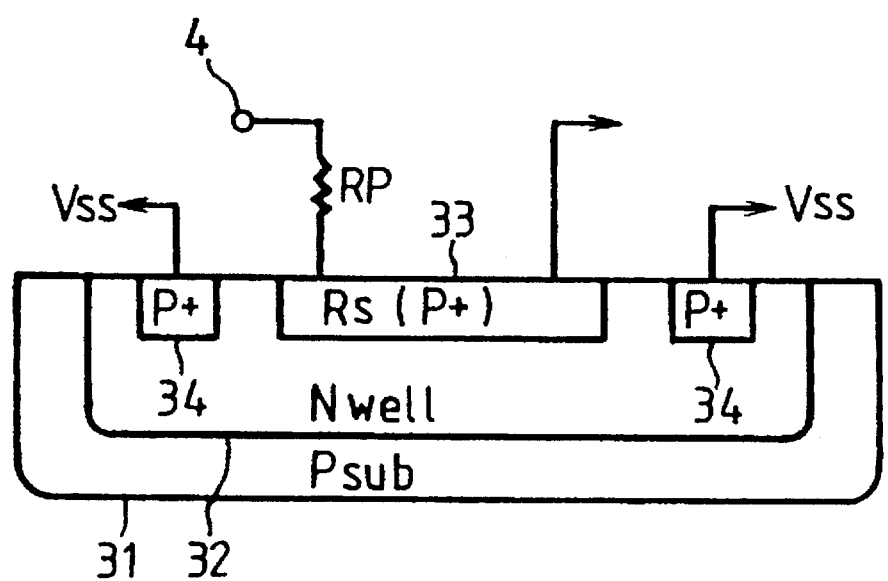
FIG. 5 is a sectional view of the layout of the protective device shown in FIG. 4.

Referring now to FIGS. 4 and 5, in the present embodiment, the floating semiconductor substrate 31 is a p-type substrate. The floating well 32 is formed in the substrate 31 by implanting n-type impurity into the substrate 31. The diffusion resistor 33 is formed in the well 32 by implanting p-type impurity into the well 32. The diffusion resistor 33 has a first terminal connected electrically to a first metal lead 35 and a second terminal connected electrically to the driven circuit stage 5 via a second metal lead 36. The grounded region 34 is formed in the well 32 around the diffusion resistor 33 by implanting p-type impurity into the well 32, and by applying a ground reference voltage (VSS) to the grounded region 34. The polysilicon resistor (RP) has a first terminal connected electrically to the output terminal 4 of the driving circuit stage and a second terminal connected electrically to the first metal lead 35 so as to connect the diffusion resistor 33 to the output terminal 4 of the driving circuit stage.

Since the diffusion resistor 33 and the grounded region 34 are formed by implanting p-type impurity into the well 32 which is formed by implanting n-type impurity into the substrate 31, and since the diffusion resistor 33 is not connected to the grounded region 34, the diffusion resistor 33, the well 32 and the grounded region 34 cooperatively define thereamong a diac region which can be expressed as a plurality of diac units (G1 to Gn), as shown in FIG. 3. It should be noted that each of the diac units (G1 to Gn) consists of first and second diodes (D1 and D2), the cathodes of which are interconnected.

Suppose that a large positive voltage is present at the output terminal 4 of the driving circuit stage, and that the large positive voltage is smaller than the reverse breakdown voltage of the second diode (D2), the first diode (D1) conducts while the second diode (D2) does not conduct. When the large positive voltage present at the output terminal 4 of the driving circuit stage is larger than the reverse breakdown voltage of the second diode (D2), breakdown of the second diode (D2) occurs so as-to form a discharge path through which a large amount of current is drained, thereby preventing large current flows from the driving circuit stage to the driven circuit stage. On the other hand, if a large negative voltage is present at the output terminal 4 of the driving circuit stage, and if the large negative voltage is smaller than the reverse breakdown voltage of the first diode (D1), the second diode (D2) conducts while the first diode (D1) does not conduct. When the large negative voltage present at the output terminal 4 of the driving circuit stage is larger than the reverse breakdown voltage of the first diode (D1), breakdown of the first diode (D1) occurs so as to form a discharge path through which a large amount of current is drained, thereby preventing large current flows from the driving circuit stage to the driven circuit stage in the reverse direction. Therefore, the protective device 3 of the present invention is activated when the large positive voltage present at the output terminal of the driving circuit stage reaches the reverse breakdown voltage of the first diode (D1), or when the large negative voltage present at the output terminal of the driving circuit stage reaches the reverse breakdown voltage of the second diode (D2). Furthermore, the diffusion resistor 33 and the polysilicon resistor (RP) reduce the voltage applied to the gate oxide of the transistors (M1,M2) and the amount of current flowing into the gate terminals of the transistors (M1,M2). Therefore, the polysilicon resistor (RP) and the diffusion resistor 33 can assist in protecting the transistors (M1,M2).

From the foregoing, it is noted that the reverse breakdown voltages of the diodes (D1,D2) are larger than the voltage source (VDD). Therefore, the voltage present at the output terminal 4 of the driving circuit stage can be limited within a much larger range than that of the prior art without the need for utilizing a voltage level converter.

It should be appreciated that a protective device which includes an N-type floating substrate, a P-type floating well, an N-type diffusion resistor and an N-type grounded region, is obviously included within the scope of the present invention.

While the present invention has been described in connection with what is considered the most practical and preferred embodiment, it is understood that this invention is not limited to the disclosed embodiment, but is intended to cover various arrangements included within the spirit and scope of the broadest interpretation so as to encompass all such modifications and equivalent arrangements.

I claim:

1. A method for manufacturing a protective device in an integrated circuit with a driving circuit stage and a driven circuit stage, comprising the steps of:

(1) implanting first conductivity-type impurity into a second conductivity-type floating semiconductor substrate to form a floating well in said substrate;

(2) forming a diffusion resistor in said well by implanting second conductivity-type impurity into said well, said diffusion resistor having a first terminal to be connected electrically to said driving circuit stage and a second terminal to be connected electrically to said driven circuit stage; and (3) forming a grounded region in said well around said diffusion resistor by implanting second conductivity-type impurity into said well, and by applying a ground reference voltage to said grounded region;

whereby, said diffusion resistor, said well and said grounded region cooperatively define thereamong a diac region which prevents large current flows from said driving circuit stage to said driven circuit stage when a relatively large voltage is present at said first terminal of said diffusion resistor.

2. A method of manufacturing a protective device as claimed in claim 1, further comprising the step of connecting a polysilicon resistor to said first terminal of said diffusion resistor which serves to connect said diffusion resistor to said driving circuit stage.

* * * * *